United States Patent
Hori et al.

(10) Patent No.: US 9,385,243 B2
(45) Date of Patent: Jul. 5, 2016

(54) SEMICONDUCTOR DEVICE

(71) Applicant: KABUSHIKI KAISHA TOSHIBA, Minato-Ku, Tokyo (JP)

(72) Inventors: Yoichi Hori, Himeji Hyogo (JP); Takao Noda, Himeji Hyogo (JP); Tsuyoshi Oota, Ibo Hyogo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 48 days.

(21) Appl. No.: 14/475,568

(22) Filed: Sep. 2, 2014

(65) Prior Publication Data
US 2015/0372153 A1    Dec. 24, 2015

(30) Foreign Application Priority Data
Jun. 19, 2014   (JP) ................. 2014-126256

(51) Int. Cl.
*H01L 27/02* (2006.01)
*H01L 29/872* (2006.01)
*H01L 23/00* (2006.01)
*H01L 23/482* (2006.01)
*H01L 29/06* (2006.01)
*H01L 29/16* (2006.01)

(52) U.S. Cl.
CPC ............ *H01L 29/872* (2013.01); *H01L 23/482* (2013.01); *H01L 24/05* (2013.01); *H01L 24/49* (2013.01); *H01L 29/0619* (2013.01); *H01L 29/1608* (2013.01); *H01L 2224/04042* (2013.01); *H01L 2224/4813* (2013.01); *H01L 2224/4846* (2013.01); *H01L 2224/4847* (2013.01); *H01L 2224/491* (2013.01)

(58) Field of Classification Search
CPC ................ H01L 727/0255; H01L 27/0251; H01L 27/0266; H01L 27/0629; H01L 27/0259
USPC ................................................ 257/356
See application file for complete search history.

(56) References Cited

U.S. PATENT DOCUMENTS 6,274,908 B1 * 8/2001 Yamaguchi ......... H01L 27/0251
                                                      257/173
6,806,548 B2 * 10/2004 Shirai ................. H01L 29/475
                                                      257/334

FOREIGN PATENT DOCUMENTS

JP   2014-029975 A   2/2014

* cited by examiner

*Primary Examiner* — Monica D Harrison
(74) *Attorney, Agent, or Firm* — Patterson & Sheridan, LLP

(57) ABSTRACT

A semiconductor device includes a first electrode, a second electrode, a first semiconductor region that is formed between the first electrode and the second electrode and is in contact with the first electrode, a second semiconductor region that is formed between the first semiconductor region and the second electrode, a contact region that is formed between the second semiconductor region and the second electrode and is in contact with the second semiconductor region and the second electrode, a plurality of third semiconductor regions that are formed between the second electrode and the first semiconductor region and are in contact with the second electrode, and a wiring that is in contact with the second electrode, a portion of the wiring bonded to the second electrode being positioned above the third semiconductor region and not positioned above the contact region.

20 Claims, 9 Drawing Sheets

SEMICONDUCTOR DEVICE

CROSS-REFERENCE TO RELATED APPLICATION

This application is based upon and claims the benefit of priority from Japanese Patent Application No. 2014-126256, filed Jun. 19, 2014, the entire contents of which are incorporated herein by reference.

FIELD

Embodiments described herein relate to a semiconductor device.

BACKGROUND

In semiconductor devices functioning as current rectifiers, there has been known a Junction Barrier Schottky (JBS) diode using a Schottky barrier junction combined with a pn junction. The JBS diode includes a plurality of p-type semiconductor regions which are formed within an n-type semiconductor region, and a Schottky barrier metal which contacts the n-type semiconductor region and the p-type semiconductor regions. The JBS diode is configured such that when a reverse bias is applied thereto, the electric field at the interface between the n-type semiconductor region and a Schottky electrode is reduced, thus lowering leakage current therethrough. It is important for a semiconductor device to further enhance resistance against a surge voltage or the like.

In the JBS diode, a Schottky barrier diode which exhibits a quick rise of an electric current may function at a low voltage, and a PIN diode having a high surge resistance may function at a high voltage. A silicide region may be formed between an anode electrode and the PIN diode. In this case, properties of an electric contact between the anode electrode and the PIN diode are enhanced.

However, when a bonding wire is disposed right above the PIN diode, or in the vicinity of the PIN diode, a concentrated electric current flows into the PIN diode through the bond region where the wire contacts the semiconductor device. This may cause a decrease in surge resistance, and may also damage the silicide region and/or a portion of the PIN diode just below the bonding wire such that adhesion between the anode electrode and the PIN diode is reduced.

DETAILED DESCRIPTION

According to an embodiment, there is provided a semiconductor device in which a reduction of surge resistance of a diode is minimized by improving a bond between an anode electrode and a diode.

In general, according to one embodiment, a semiconductor device includes: a first electrode; a second electrode; a first semiconductor region of a first conductivity type that is formed between the first electrode and the second electrode and is in contact with the first electrode; a second semiconductor region of a second conductivity type that is selectively formed between the first semiconductor region and the second electrode; a contact region that is formed between the second semiconductor region and the second electrode, and is in contact with the second semiconductor region and the second electrode; a plurality of third semiconductor regions of a second conductivity type that are formed between the second electrode and the first semiconductor region and are in contact with the second electrode; and a wiring that is in contact with the second electrode, a portion of the wiring bonded to the second electrode being positioned above the third semiconductor region and not positioned above the contact region.

Hereinafter, respective embodiments are explained by reference to the drawings. In the description made hereinafter, similar reference symbols are given to similar elements, and the repeated description of the similar elements is omitted, when appropriate.

First Embodiment

Figure 1A:
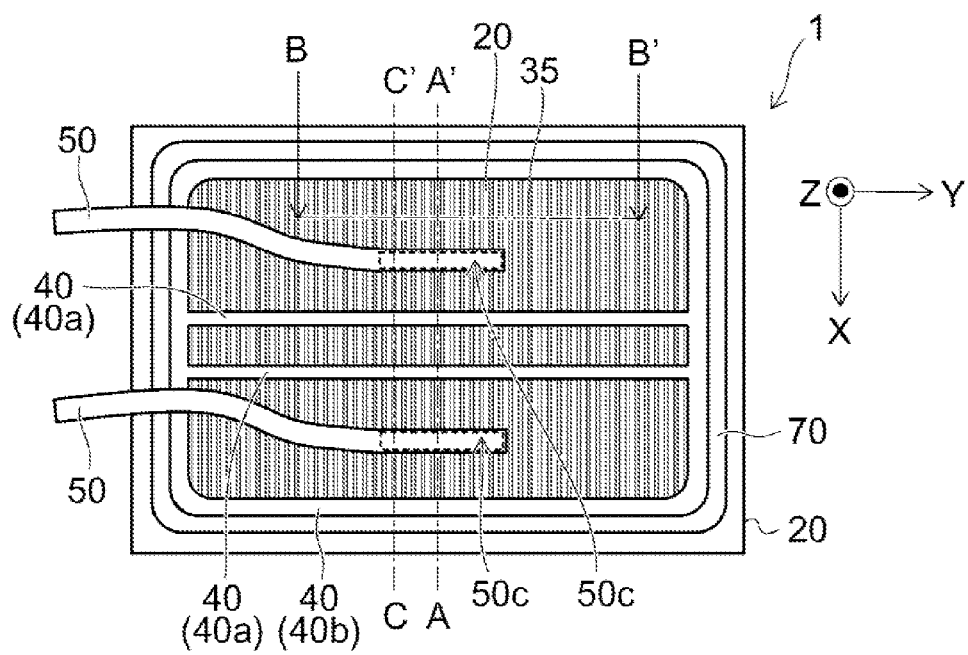
FIG. 1A is a schematic plan view illustrating a semiconductor device according to a first embodiment.

Herein, embodiments of a semiconductor device having both a Schottky barrier diode structure and a PIN diode structure are described. Beneficially to both the operation and the reliability of the device, the wiring connection to the device is located in a semiconductor region other than one overlying silicided regions of the device, preferably such that each wiring contact to the device is surrounded at the wire bonding or attachment surface by a silicided region of the device. FIG. 1A is a schematic plan view illustrating a semiconductor device according to a first embodiment, and FIG. 1B is a schematic cross-sectional view illustrating the semiconductor device according to the first embodiment.

Figure 2A:
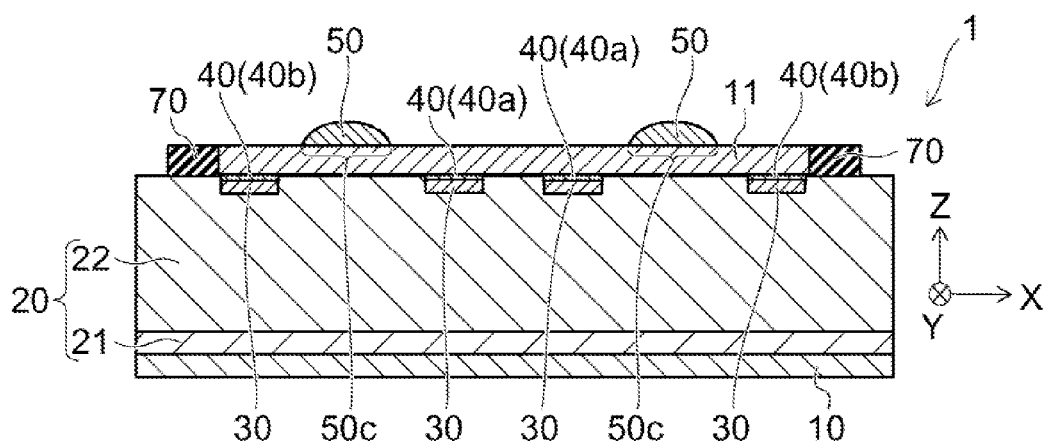
FIG. 2A is a schematic cross-sectional view illustrating the semiconductor device according to the first embodiment.
Figure 2B:
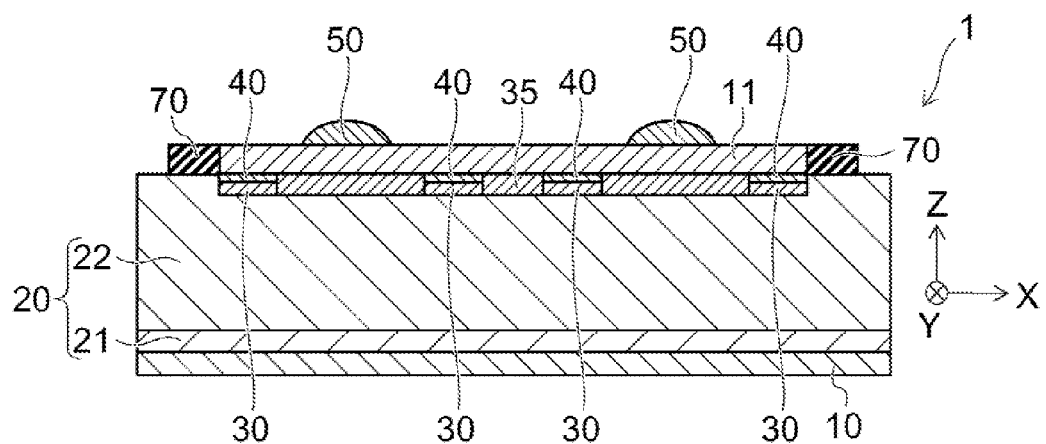
FIG. 2B is a schematic cross-sectional view illustrating the semiconductor device according to the first embodiment.

FIG. 2A and FIG. 2B are schematic cross-sectional views illustrating the semiconductor device according to the first embodiment.

Figure 1B:
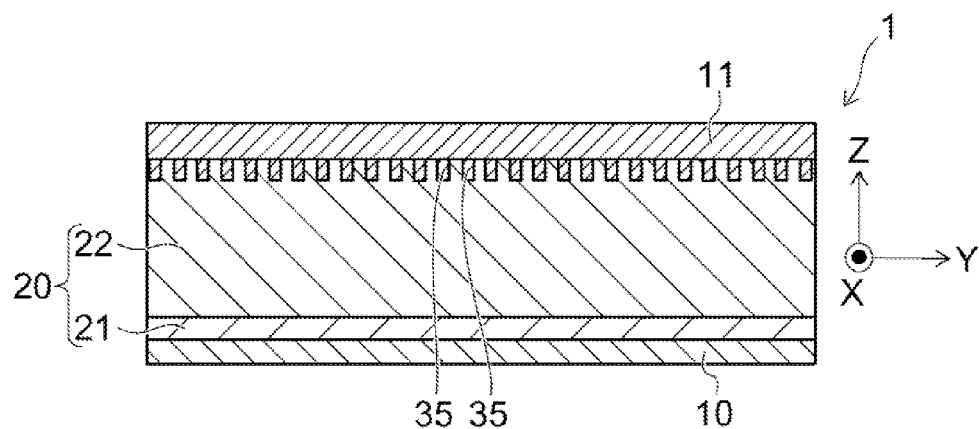
FIG. 1B is a schematic cross-sectional view illustrating the semiconductor device according to the first embodiment.

FIG. 1B illustrates a cross section taken along a line B-B' in FIG. 1A.

FIG. 2A illustrates a cross section taken along a line A-A' in FIG. 1A where a semiconductor region 35 is not present. FIG. 2B illustrates a cross section taken along a line C-C' in FIG. 1A where the semiconductor region 35 is disposed.

In FIG. 1A, an anode electrode 11 and a cathode electrode 10 illustrated in FIG. 1B is not shown for clarity.

As illustrated in FIG. 1A to FIG. 2B, the semiconductor device 1 according to the first embodiment includes: a cathode electrode 10 (first electrode (not shown in FIG. 1A)); an anode electrode 11 (second electrode (not shown in FIG. 1A)); a semiconductor region 20 (first semiconductor region); semiconductor regions 30 (second semiconductor regions); semiconductor regions 35 (third semiconductor regions); silicide regions 40 (contact regions); wirings 50; and a protective layer 70.

The semiconductor region 20 is formed between the cathode electrode 10 and the anode electrode 11. The semiconductor region 20 is in contact with the cathode electrode 10. The semiconductor region 20 includes a first portion 21 of an n$^+$ type, and a second portion 22 of an n type having lower dopant concentration than the first portion 21. The first portion 21 is formed on the inner surface side of the cathode electrode 10, and the second portion 22 is formed on the first portion 21 and extends therefrom to a location contacting an inner side surface of the anode electrode 11.

As illustrated in FIG. 2A, a plurality of semiconductor regions 30 are selectively formed between the semiconductor region 20 and the anode electrode 11. The conductivity type of the semiconductor regions 30 is a p$^+$ type. In the semiconductor device 1, a bipolar-type PIN diode (p$^+$ type layer/n type layer/n$^+$ type layer) is formed by the semiconductor region 30, the second portion 22 of the semiconductor region 20 and the first portion 21 of the semiconductor region 20. As illustrated in FIG. 2B, semiconductor regions 35 extend in a first direction (for example, the X direction) in the cross section taken along a line C-C' of FIG. 1A, and are located intermediate f adjacent semiconductor regions 30.

The silicide regions 40 are formed between the semiconductor regions 30 and the anode electrode 11. A silicide region 40 contacts each of the semiconductor regions 30 and the anode electrode 11. The semiconductor regions 30 are in ohmic contact with the silicide regions 40. By forming the silicide regions 40 between the semiconductor regions 30 and the anode electrode 11, a robust electrical contact is obtained between the semiconductor regions 30 and the anode electrode 11.

The silicide regions 40 may be formed by laser heating a semiconductor layer, photolithography processes (PEP), or the like. For example, the silicide regions 40 which are in contact with the semiconductor regions 30 may be formed by bringing a metal film into contact with the semiconductor regions 30 and, thereafter, by irradiating the semiconductor regions 30 with a laser beam to react the metal and semiconductor materials into a silicide, and thus form a silicided contact region between the semiconductor regions 30 and the metal film. A silicon component of the semiconductor region 30 and a metal component react with each other at the portion to which a laser beam is irradiated thus forming the silicide region 40. Alternatively, the silicide region 40 may be formed by selectively forming a metal film on the semiconductor region 30 using a photolithography (e.g., patterning a metal film) PEP method and, thereafter, by annealing the semiconductor region 30 and the metal film.

Wirings 50 are provided, as bonding wires, to connect the device to an external circuit or load. The wirings 50 contact with the anode electrode 11. The bonding between the wirings 50 and the anode electrode 11 may be performed by solder bonding or by direct bonding. As a method of performing direct bonding, ultrasonic bonding, compression bonding, and the like, may be used. In the semiconductor device 1, the positions of bonding portion 50c between the wirings 50 and the anode electrode 11 are selected such that the bonding portions 50c are not located above the silicide regions 40.

As illustrated in FIG. 1B, the semiconductor region 20 contacts the anode electrode 11 at multiple location intermediate of semiconductor regions 35. That is, the semiconductor region 20 is in Schottky contact with the anode electrode 11. In the semiconductor device 1, a Schottky barrier diode (SBD) is configured by the structure of the semiconductor region 20 and the anode electrode 11 shown in FIG. 1B.

A plurality of semiconductor regions 35 are formed between the anode electrode 11 and the semiconductor region 20. The silicide region 40 is interposed by the semiconductor regions 35. The conductivity type of the semiconductor regions 35 is p type. The semiconductor regions 35 contact the anode electrode 11. Each of the plurality of semiconductor regions 35 extend as a generally straight line in the first direction (for example, X direction) which intersects with a second direction (for example, Z direction), which is the direction extending from the cathode electrode 10 to the anode electrode 11. A portion of the semiconductor region 20 extends between each pair of adjacent semiconductor regions 35.

In the semiconductor device 1, the n-type semiconductor region 20 interposed between the p-type semiconductor regions 35 disposed adjacent to each other is in Schottky contact with the anode electrode 11 so that a Junction Barrier Schottky Diode (JBS diode) is there formed. That is, in the semiconductor device 1, the PIN diode and the JBS diode are disposed in parallel, in a circuit path between cathode electrode 10 and anode electrode 11.

The bonding portion 50c (shown in phantom in FIG. 1A) between the wirings 50 and the anode electrode 11, as shown in plan view in FIG. 1A is surrounded by the silicide regions 40a, 40b. Thus, a plurality of wirings 50 are bonded to the semiconductor device 1, and the bonding portion 50c of each one of the plurality of wirings 50 is surrounded by the silicide regions 40.

The silicide regions 40 include first regions 40a, and a second region 40b connected to the first regions 40a. In the semiconductor device 1, a plurality of first regions 40a are formed. The first regions 40a extend in a third direction (for example, Y direction) which intersects with the second direction (Z direction). The second region 40b surrounds the first regions 40a. A wiring width of the first region 40a and a wiring width of the second region 40b may be equal to each other or may be different from each other. In the same manner, the semiconductor regions 30 located below the silicide regions 40 also includes regions thereof which extend in the Y direction and a region which surrounds these Y-direction extending regions, for example.

The bonding portions 50c of the wirings 50 extend along the same direction that the first regions 40a extend. The bonding portions 50c extend substantially parallel to the direction that the first regions 40a extend. The bonding portions 50c are disposed parallel to each other in the X direction.

A first region 40a is located to either side of, and extends generally parallel to, the bonding portions 50c disposed adjacent to each other.

In this embodiment, n⁺ type and n type may be also referred to as a first conductivity type, and p⁺ type and p type may be also referred to as a second conductivity type. Here, n⁺ type and n type, or p⁺ type and p type, means that dopant concentration is higher in the + type and lower in the other types.

A main component of the semiconductor region 20, a main component of the semiconductor region 30 and a main component of the semiconductor region 35 is silicon carbide (SiC), silicon (Si) or the like, for example.

When a semiconductor material of the semiconductor device 1 contains silicon carbide (SiC) as a main component, for example, nitrogen (N), phosphorous (P) or the like is used as a dopant element of a first conductivity type and, for example, aluminum (Al), boron (B) or the like is used as a dopant element of a second conductivity type.

When the semiconductor material of the semiconductor device 1 contains silicon (Si) as a main component, for example, phosphorous (P), arsenic (As), or the like, is used as a dopant element of a first conductivity type. On the other hand, for example, boron (B), or the like, is used as a dopant element of a second conductivity type.

A material of the cathode electrode 10 and the anode electrode 11 contains at least one metal selected from a group including, for example, aluminum (Al), titanium (Ti), nickel (Ni), tungsten (W), molybdenum (Mo), copper (Cu), gold (Au), platinum (Pt) and the like. These metals may form a laminated, i.e., stacked, structure. For example, the anode electrode 11 may be formed of a laminated body which is formed by laminating Ti and Al in this order from a side of the semiconductor region 20. Further, the wirings 50 may be made of gold (Au), aluminum (Al) or the like, for example.

The silicide region 40 is a layer formed by siliciding the underlying semiconductor material of the semiconductor regions 30 by reaction with at least one metal selected from a group including nickel (Ni), aluminum (Al), titanium (Ti), tungsten (W), molybdenum (Mo), copper (Cu), gold (Au), platinum (Pt) and the like.

Before explaining the manner of operation of the semiconductor device 1, the manner of operation of a semiconductor device 100 according to a reference example is explained.

Figure 3A:
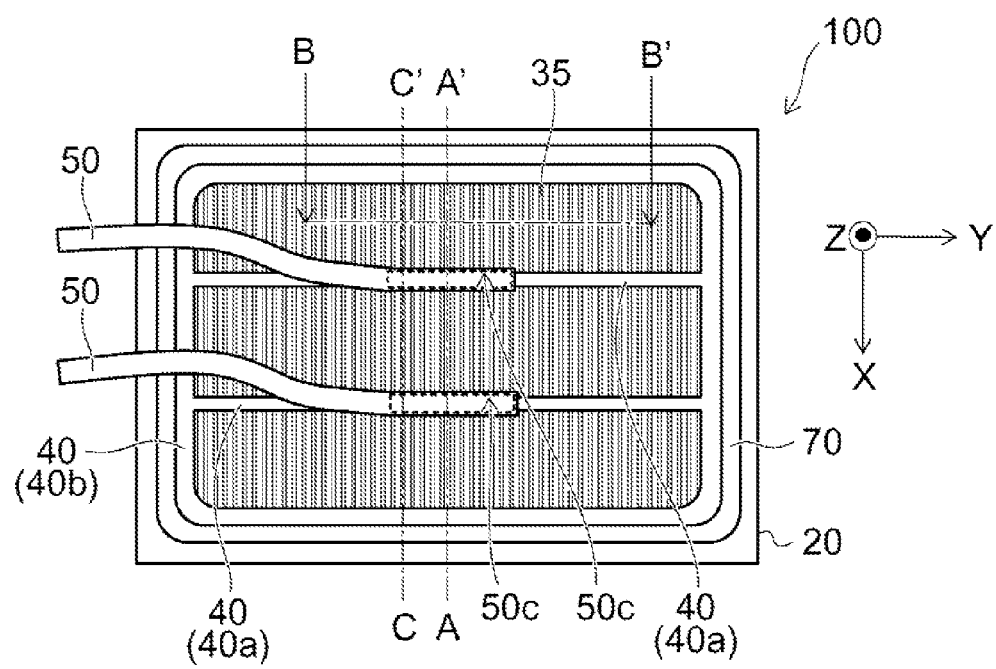
FIG. 3A is a schematic plan view illustrating a semiconductor device according to a reference example.
Figure 3B:
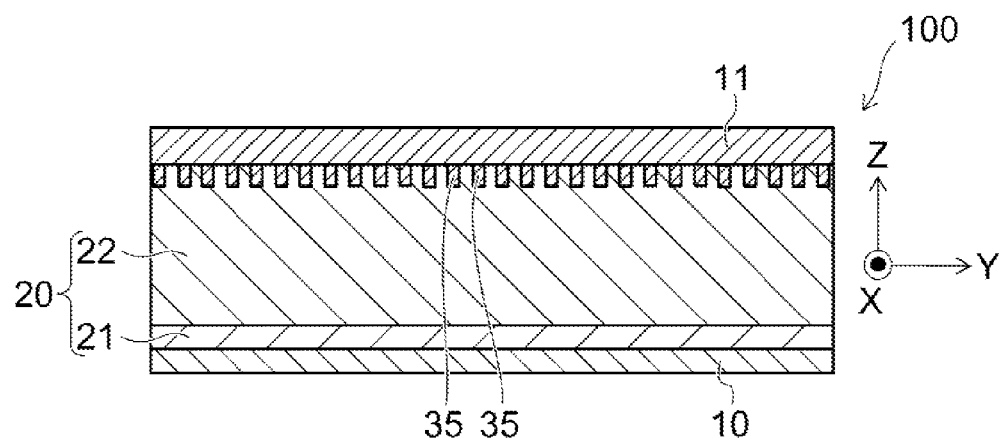
FIG. 3B is a schematic cross-sectional view illustrating the semiconductor device according to the reference example.

FIG. 3A is a schematic plan view illustrating a semiconductor device according to the reference example, and FIG. 3B is a schematic cross-sectional view illustrating the semiconductor device according to the reference example.

Figure 4A:
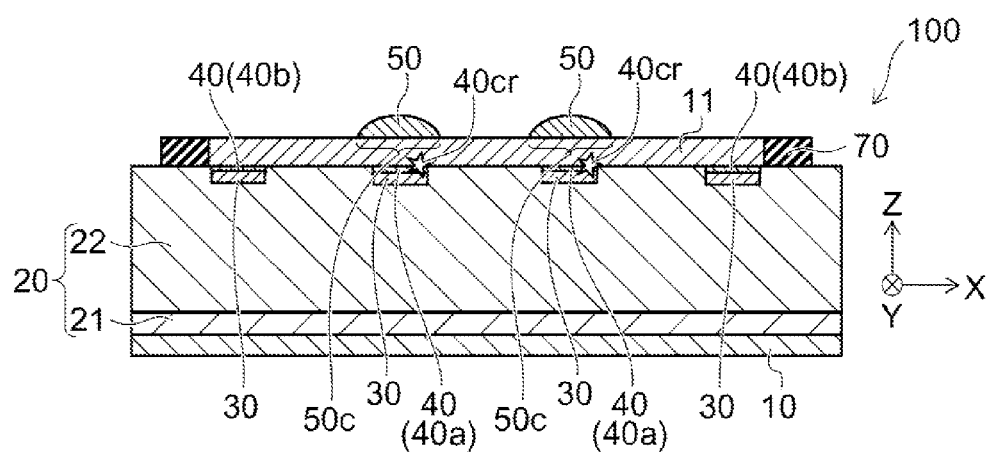
FIG. 4A is a schematic cross-sectional view illustrating the semiconductor device according to the reference example.
Figure 4B:
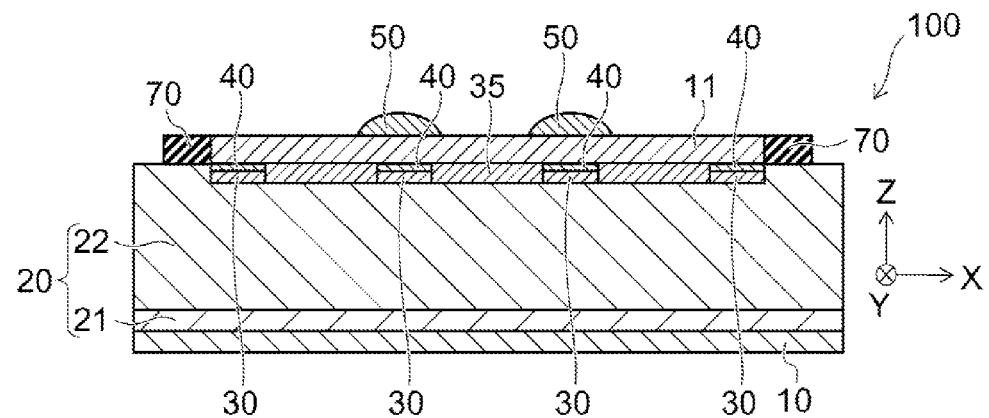
FIG. 4B is a schematic cross-sectional view illustrating the semiconductor device according to the reference example.

FIG. 4A and FIG. 4B are schematic cross-sectional views illustrating the semiconductor device according to the reference example.

FIG. 3B illustrates a cross section taken along a line B-B' in FIG. 3A.

FIG. 4A illustrates a cross section taken along a line A-A' in FIG. 3A where semiconductor regions 35 are not present. FIG. 4B illustrates a cross section taken along a line B-B' in FIG. 3A where the semiconductor regions 35 are present.

In the semiconductor device 100 according to the reference example, wirings 50 are disposed just above silicide regions 40 (first regions 40a). The structure of the semiconductor device 100 is equivalent to the structure of the semiconductor device 1 except for a point that the wirings 50 are located just above the silicide regions 40 (first region 40a). That is, also in the semiconductor device 100, PIN diodes are formed which include a semiconductor region 30, a second portion 22 of a semiconductor region 20, and a first portion 21 of the semiconductor region 20. Further, JBS diodes are formed which include the semiconductor region 20, the semiconductor region 35 and the anode electrode 11.

Figure 5:
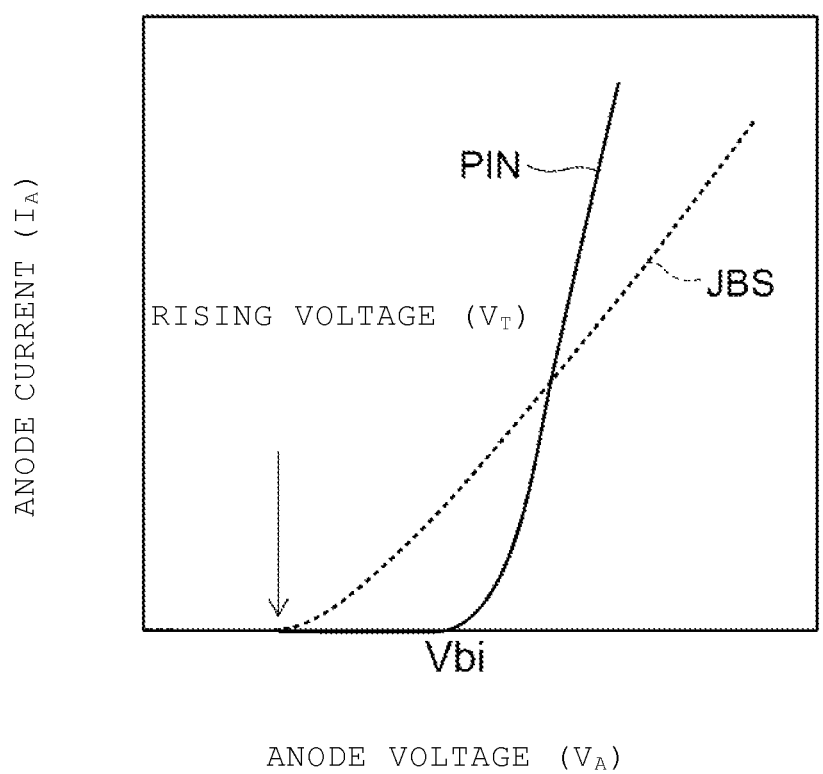
FIG. 5 is a graph illustrating one example of a forward characteristic of the semiconductor device according to the reference example.

FIG. 5 is a graph illustrating one example of forward bias characteristics of the semiconductor device according to the reference example. In FIG. 5, an anode voltage (forward bias voltage) ($V_A$) is shown on the abscissa, and an anode current (forward current) ($I_A$) is shown on the ordinate.

In the semiconductor device 100 of the reference example, before a forward bias voltage (V) reaches the built-in voltage (Vbi) of the PIN diode which voltage must be reached before current can flow across the PIN diode, the operational voltage of the JBS is met and the forward current (I) which flows through the JBS having the Schottky junction dominates the functioning of the semiconductor device 100. Here, a forward bias means a state where a potential of the anode electrode 11 is higher than a potential of the cathode electrode 10. Further, when the forward bias voltage (V) exceeds the built-in voltage (Vbi) of the PIN diode, a forward current (I) which flows through the PIN diode dominates the functioning of the semiconductor device 100.

That is, in the semiconductor device 100, before a forward bias voltage (V) reaches a built-in voltage (Vbi), the JBS portion of the device preferentially functions, and when the forward bias voltage (V) exceeds the built-in voltage (Vbi), the PIN diode portion of the device preferentially functions. Accordingly, in the semiconductor device 100, the switching characteristic is improved thus enhancing a surge resistance.

Further, when a reverse bias is applied, depletion in the portions of the semiconductor region 20 extending between adjacent semiconductor regions 35 is accelerated so that a leak current at a Schottky bonding portion is suppressed. Here, a reverse bias means a state where a potential of the cathode electrode 10 is higher than a potential of the anode electrode 11.

However, the silicide region 40 of the semiconductor device 100 is formed by a thermal reaction between silicon and metal. Here, there may be a case where unevenness is formed on a surface of the silicide region 40 or pores or voids are formed within the silicide region 40 after a thermal reaction.

As a quality control measure a tensile test is performed on a semiconductor device 100 wherein the wiring 50 is pulled from the anode electrode 11 by a predetermined force to confirm the adhesive strength between the wiring 50 and the anode electrode 11. Further, when the wiring 50 of the semiconductor device 100 is directly bonded to the anode electrode 11, there may be a case where stress is applied to the silicide region 40 by the wiring 50. Still further, there may be a case where stress is applied just below the bonding portion 50c owing to a residual tensile or compressive force in the wiring 50.

Accordingly, as in the case of the semiconductor device 100, when the wiring 50 is formed just above the silicide region 40 (first region 40a), a stress is applied to the silicide regions 40 so that cracks 40cr (chips, fissures or the like) are liable to be generated within the silicide region 40 (FIG. 4A) of the semiconductor device 100. When such a crack 40cr occurs, the adhesive strength between the silicide region 40 and the semiconductor region 30, or the adhesive strength between the silicide region 40, and the anode electrode 11 is lowered. Still further, owing to the occurrence of cracks 40cr, cracks may also occur in the semiconductor region below the silicide region 40 thus giving rise to a case where a rectifying characteristic of the PIN diode is adversely affected, or cracks become a factor which allow generation of a leak current, for example.

Further, there may be a case where a surge current flows in the wiring 50. In such a case, when the wiring 50 is formed just above the silicide region 40 (first region 40a) so that the semiconductor region 30 is in ohmic contact with the silicide region 40, a surge current is concentrated on the semiconductor region 30 just below the wiring 50. Accordingly, the surge current flows in a specific semiconductor region 30 in a concentrated manner thus giving rise to a case where a PIN diode including the semiconductor region 30 is thermally destroyed.

On the other hand, the manner of operation of the semiconductor device 1 according to the first embodiment is explained hereinafter.

Figure 6A:
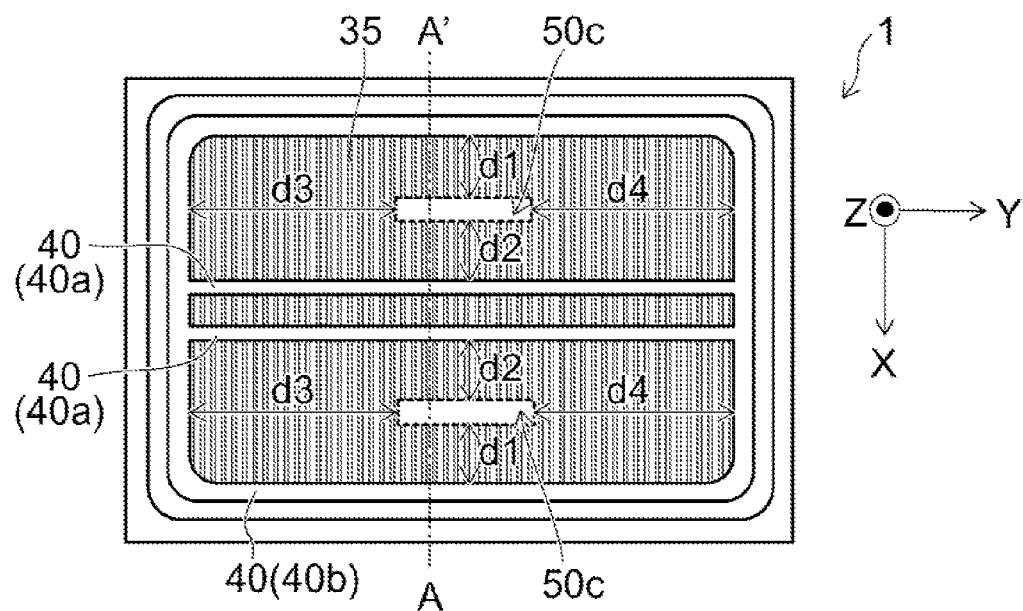
FIG. 6A is a schematic plan view illustrating the semiconductor device according to the first embodiment.
Figure 6B:
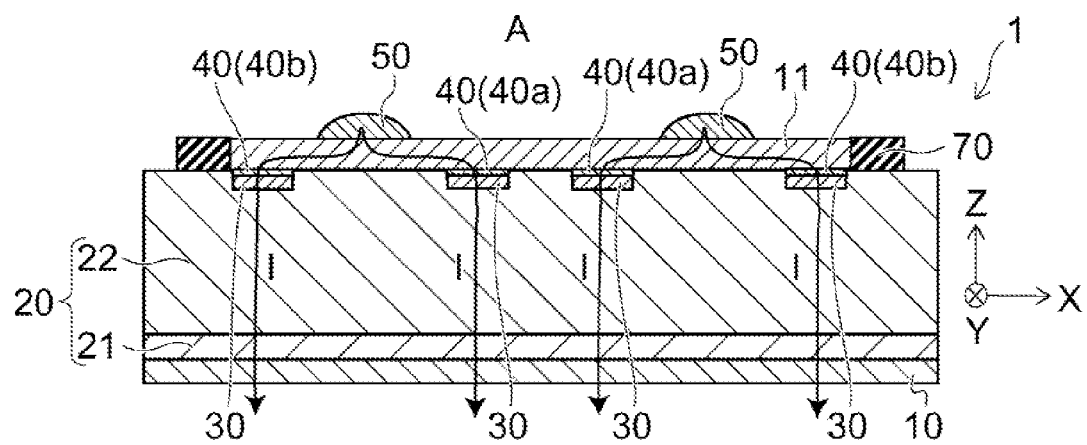
FIG. 6B is a schematic cross-sectional view illustrating the semiconductor device according to the first embodiment.

FIG. 6A is a schematic plan view illustrating the semiconductor device according to the first embodiment, and FIG. 6B is a schematic cross-sectional view illustrating the semiconductor device according to the first embodiment.

FIG. 6B illustrates a cross section taken along a line A-A' in FIG. 6A. Further, the anode electrode 11 and the wiring 50 illustrated in FIG. 6B are not illustrated in FIG. 6A for clarity.

In the semiconductor device 1, the wirings 50 are not formed just above the silicide regions 40 (first regions 40a) and instead are formed between adjacent or within surrounding silicide regions 40, i.e., the silicide regions 40a and 40b surround the wiring 50 locations. Accordingly, even when a tensile test of the wiring 50, or direct bonding between the wiring 50 and the anode electrode 11 is performed, or even when the wiring 50 has an elastic force, a stress applied to the silicide region 40 the semiconductor device 1 is lowered, as compared to the semiconductor device 100.

Accordingly, in the semiconductor device 1, cracks may minimally occur on the inside of the silicide region 40. However, the positioning of the wiring 50 makes it possible to maximize adhesion strength between the silicide region 40 and the semiconductor region 30, or between the silicide region 40 and the anode electrode 11 (i.e., suppress lowering of the adhesion between the silicide region 40 and the semiconductor region 30, or lowering of the adhesion between the silicide region 40 and the anode electrode 11). Thus, any cracks that may minimally occur in a semiconductor region below the silicide region 40 do not affect the physical and/or electrical properties of the semiconductor device 1.

As shown in FIG. 6A, a distance d1 between the bonding portion 50c and the second silicide region 40b and a distance d2 between the bonding portion 50c and the first silicide region 40a may be substantially equal to each other. Further, a distance d3 between the bonding portion 50c and the second silicide region 40b, and a distance d4 between the bonding portion 50c and the second silicide region 40b may be substantially equal to each other. By adopting such an arrangement, the local surge currents may be further suppressed.

For example, FIG. 6B illustrates a state where a surge current I flows to a cathode electrode 10 from the wiring 50. In the semiconductor device 1, the surge current I is dispersed over the interior of the anode electrode 11 connected to the wiring 50, and the dispersed surge current I flows into the cathode electrode 10 though the PIN diode. Accordingly, a surge current is minimally concentrated on the specific semiconductor region 30 so that the PIN diode containing the semiconductor region 30 such that thermal deterioration of the semiconductor device 1 is minimized.

In this manner, in the semiconductor device 1, the adhesion between the anode electrode 11 and the PIN diode may be improved and hence, the surge current resistance of the PIN diode is enhanced. That is, the lowering of an adhesion caused by the arrangement of the PIN portion just below the bonding portion 50c as described in FIGS. 3A-4B may be obviated, and the bonding portion 50c is surrounded by the PIN portion. Accordingly, in the semiconductor device 1, it is possible to supply a large current in a wide region of the PIN portion thus increasing the surge current resistance.

The surge resistance may be defined as an electrical characteristic which ensures the reliability of an element such that the element is not ruptured when an inrush current or voltage enters the element, for example. The semiconductor device 1 has a higher surge resistance than the semiconductor device 100.

Second Embodiment

Figure 7A:
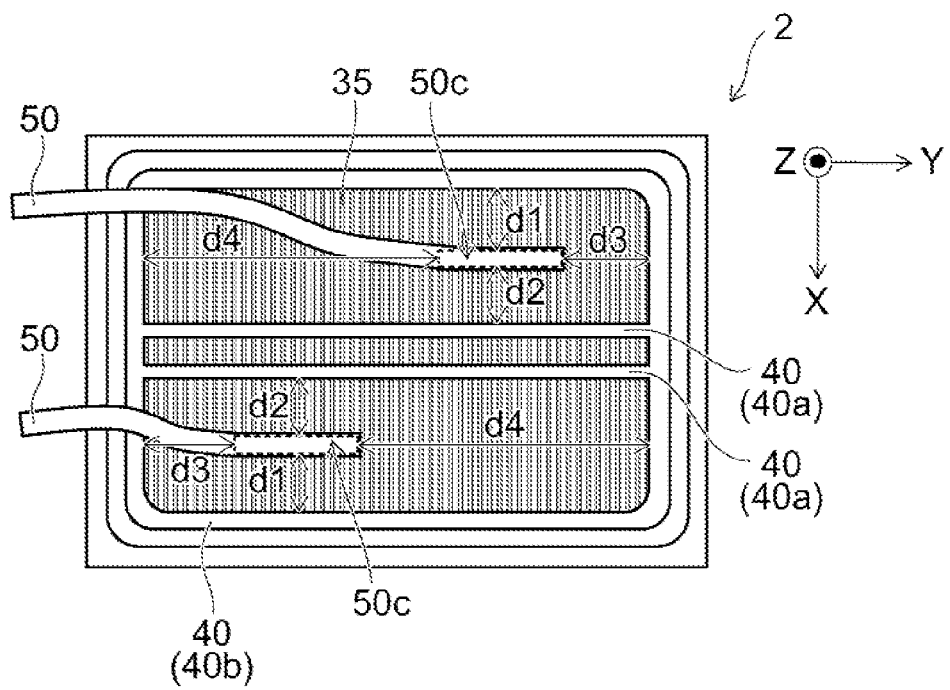
FIG. 7A is a schematic plan view illustrating a semiconductor device according to a first example of a second embodiment.
Figure 7B:
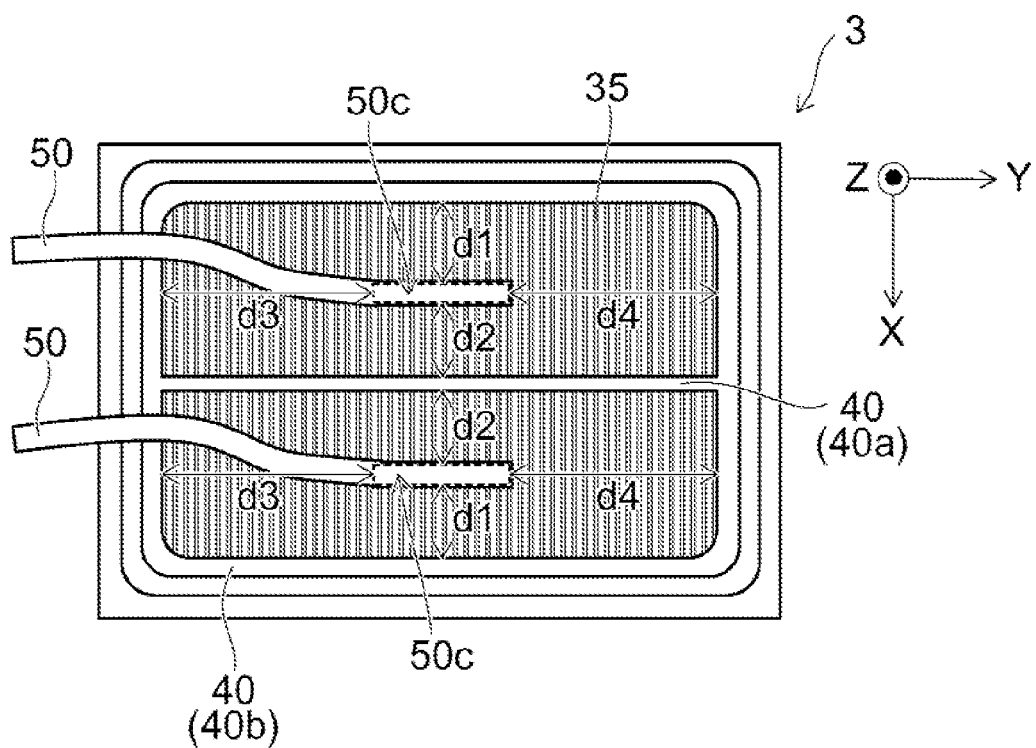
FIG. 7B is a schematic plan view illustrating a semiconductor device according to a second example of the second embodiment.

FIG. 7A is a schematic plan view illustrating a semiconductor device according to a first example of a second embodiment, and FIG. 7B is a schematic plan view illustrating a semiconductor device according to a second example of the second embodiment.

Figure 8A:
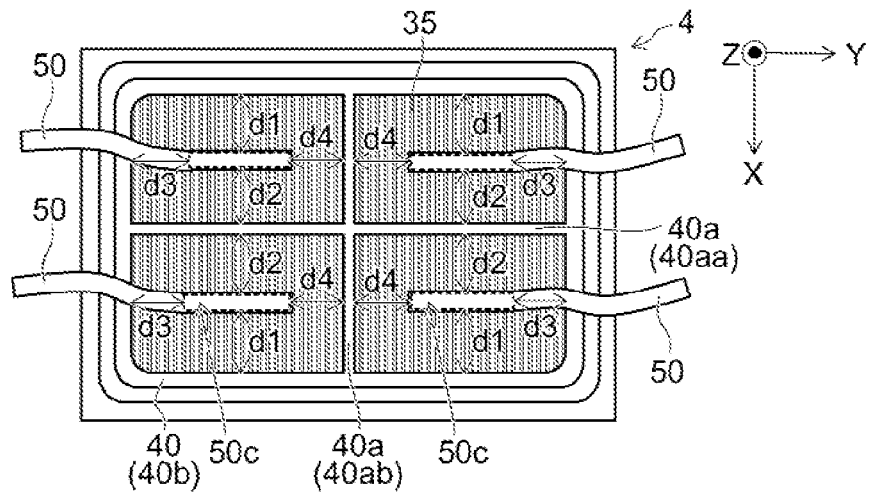
FIG. 8A is a schematic plan view illustrating a semiconductor device according to a third example of the second embodiment.
Figure 8B:
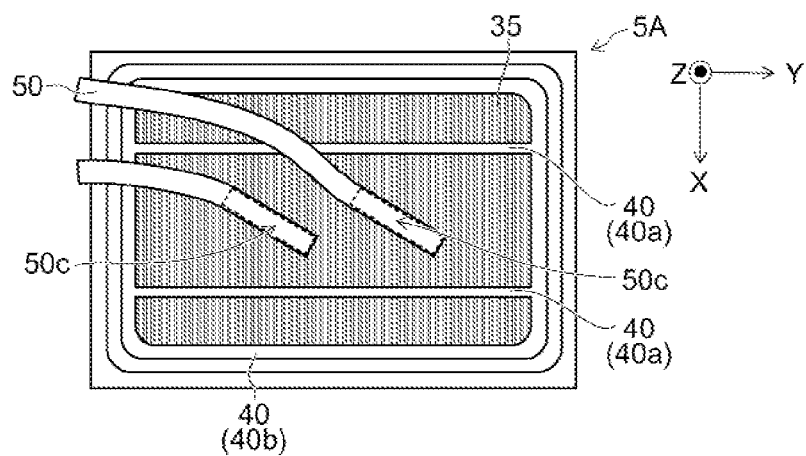
FIG. 8B is a schematic plan view illustrating a semiconductor device according to a fourth example of the second embodiment.
Figure 8C:
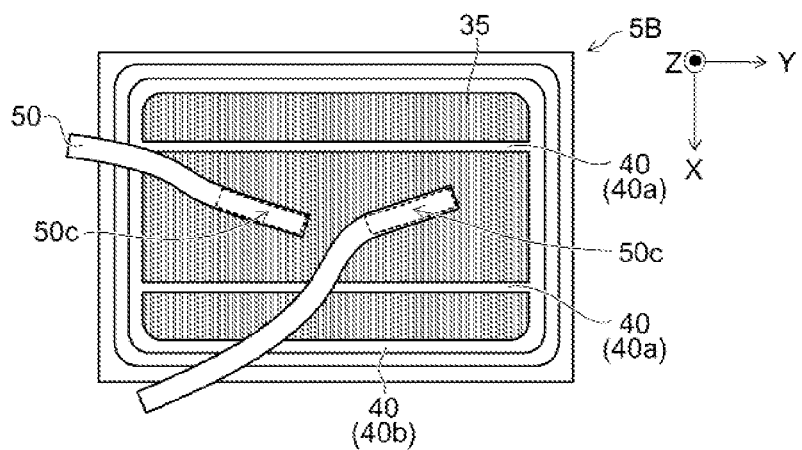
FIG. 8C is a schematic plan view illustrating a semiconductor device according to a fifth example of the second embodiment.

FIG. 8A is a schematic plan view illustrating a semiconductor device according to a third example of the second embodiment, FIG. 8B is a schematic plan view illustrating a semiconductor device according to a fourth example of the second embodiment, and FIG. 8C is a schematic plan view illustrating a semiconductor device according to a fifth example of the second embodiment.

In the semiconductor device 2 illustrated in FIG. 7A, bonding portions 50c disposed adjacent to each other extend parallel to each other in the Y direction while the relative locations thereof are displaced from each other in the Y direction. Here, a distance d1 between a bonding portion 50c and a second region 40b and a distance d2 between the bonding portion 50c and the first region 40a may be substantially equal to each other. Further, a distance d3 between the bonding portion 50c and the second region 40b is shorter than a distance d4 between the bonding portion 50c and the second region 40b.

Further, as shown in FIG. 7B, the number of first regions 40a of a silicide region 40 may be one. Here, a distance d1 between the bonding portion 50c and a second region 40b and the distance d2 between the bonding portion 50c and the first region 40a may be substantially equal to each other. Further, the distance d3 between the bonding portion 50c and the second region 40b and the distance d4 between the bonding portion 50c and the second region 40b may be substantially equal to each other.

Further, as in the case of the semiconductor device 4 illustrated in FIG. 8A, a first region 40a of a silicide region 40 may have a portion 40aa thereof extending in the Y direction, and a portion 40ab thereof extending in the X direction. Owing to such a structure, a surge current which flows in a PIN diode may be further dispersed and hence, the surge resistance is further increased. Here, a distance d1 between the bonding portion 50c and a second region 40b and a distance d2 between the bonding portion 50c and a portion 40aa of the first region 40a may be substantially equal to each other. Further, the distance d3 between the bonding portion 50c and the second region 40b and the distance d4 between the bonding portion 50c and a portion ab of the first region 40a may be substantially equal to each other.

Further, in the case of the semiconductor device 5A illustrated in FIG. 8B, it is unnecessary to extend bonding portions 50c substantially parallel to the direction that a first region 40a extends, and the direction that the bonding portions 50c extend and the direction that the first region 40a extends may intersect with each other. Further, bonding portions 50c may be disposed as in the case of a semiconductor device 5B illustrated in FIG. 8C. By disposing the bonding portions 50c obliquely to the first silicide regions 40a as described above, the number of wirings 50 may be increased or a diameter of the wiring 50 may be increased thus lowering the resistance of the wirings 50.

The semiconductor devices 2 to 5 which have been explained heretofore may acquire the same manner of operation and advantageous effects as the semiconductor device 1.

Third Embodiment

Figure 9A:
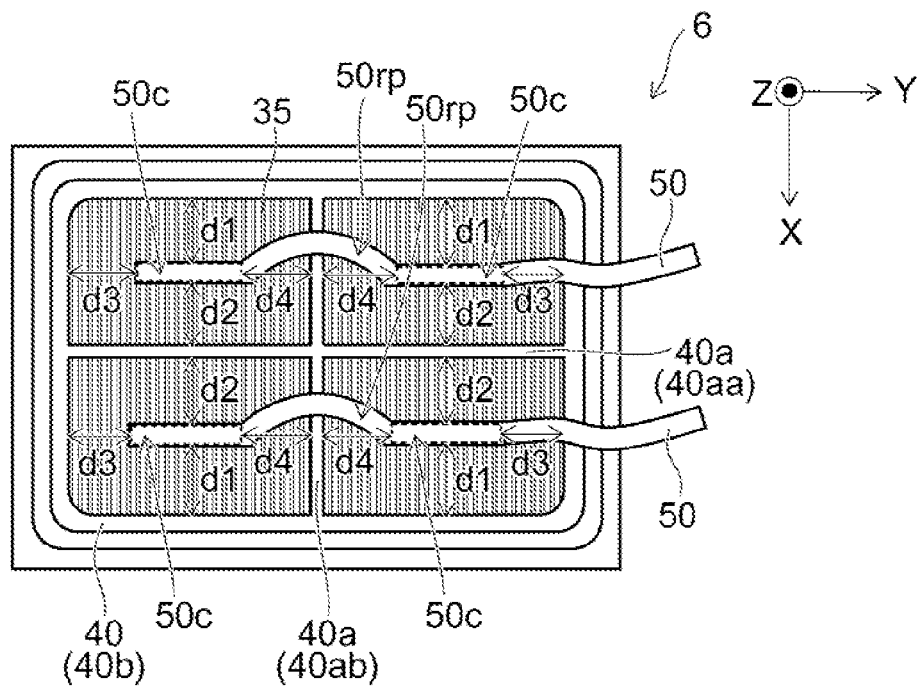
FIG. 9A is a schematic plan view illustrating a semiconductor device according to a first example of a third embodiment.
Figure 9B:
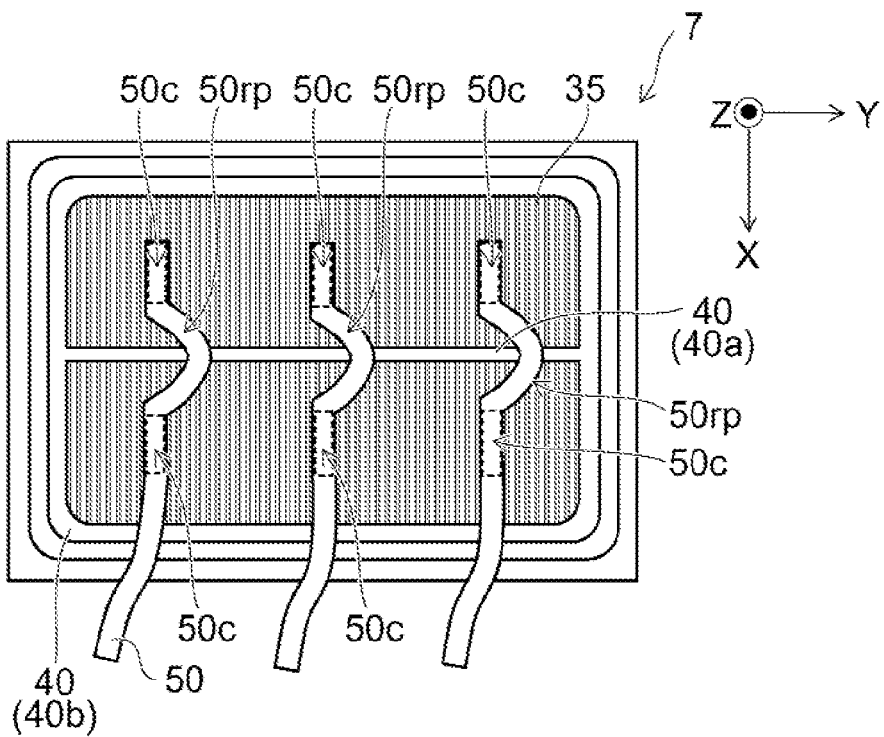
FIG. 9B is a schematic plan view illustrating a semiconductor device according to a second example of the third embodiment.

FIG. 9A is a schematic plan view illustrating a semiconductor device according to a first example of a third embodiment; and FIG. 9B is a schematic plan view illustrating a semiconductor device according to a second example of the third embodiment.

In the semiconductor device 6 illustrated in FIG. 9A, one wiring 50 has a plurality of bonding portions 50c. Owing to such structure, the number of wirings 50 may be decreased. For example, the bonding portions 50c which are disposed in the Y direction are connected to each other by a loop-shaped connecting portion 50rp which is not in contact with the semiconductor device 6. The plurality of bonding portions 50c are respectively surrounded by a silicide region 40.

Here, a distance d1 between the bonding portion 50c and a second region 40b and the distance d2 between the bonding portion 50c and a portion 40aa of the first region 40a may be substantially equal to each other. Further, the distance d3 between the bonding portion 50c and the second region 40b and the distance d4 between the bonding portion 50c and a portion ab of the first region 40a may be substantially equal to each other.

The direction that the bonding portions 50c extend is not limited to the Y direction. For example, the bonding portions 50c may extend in the X direction as in the case of a semiconductor device 7 illustrated in FIG. 9B.

The semiconductor devices 6, 7 which have been described herein have the same manner of operation and advantageous effects as the semiconductor device 1.

As a semiconductor material, for example, a nitride semiconductor, or the like, may be used in place of SiC and Si. Here, "nitride semiconductor" includes a III-V group compound semiconductor of $B_xIn_yAl_zGa_{1-x-y-z}N$ ($0 \leq x \leq 1$, $0 \leq y \leq 1$, $0 \leq z \leq 1$, $0 \leq x+y+z \leq 1$). Further, the semiconductor material includes mixed crystal structures which contain phosphorus (P), arsenic (As), or the like, in addition to N (nitrogen) as V group elements. Still further, the semiconductor material may include various elements which are utilized for controlling various physical properties, such as a conductivity type, and may further include various trace elements.

The embodiments of the present disclosure have been explained by reference to the specific examples heretofore. However, the embodiments of the present disclosure are not limited to these specific examples. That is, examples which are prepared by adding suitable design changes to these specific examples by those who are skilled in the art may be also embraced in the category of the embodiments of the present disclosure provided that these examples also include the technical features of the embodiments. The structural elements which the above-mentioned respective specific examples include and the arrangements, the materials, the conditions, the shapes, the size and the like of these structural elements are not limited to the exemplified values and may be suitably changed.

Further, the respective structural elements which the above-mentioned respective embodiments include may be combined with each other provided that such combinations are technically feasible, and these combinations are also embraced in the category of the embodiments of the present disclosure provided that these combinations also include the technical features of the embodiments of the present disclosure. Still further, various variations and modifications are conceivable to those who are skilled in the art within a category of the technical concept of the embodiments of the present disclosure, and it is construed that these variations and modifications also fall within the scope of the present disclosure.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a first electrode;
   a second electrode;
   a first semiconductor region of a first conductivity type located between the first electrode and the second electrode and is in contact with the first electrode;
   a second semiconductor region of a second conductivity type that is selectively located between the first semiconductor region and the second electrode;
   a plurality of contact regions located between the second semiconductor region and the second electrode, each contact region being in contact with the second semiconductor region and the second electrode;
   a plurality of third semiconductor regions of a second conductivity type located between the second electrode and the first semiconductor region and in contact with the second electrode; and
   a wiring in contact with the second electrode via a bonding portion, the bonding portion of the wiring bonded to the second electrode at a location between the contact regions adjacent to the third semiconductor region.

2. The device according to claim 1, wherein the first semiconductor region includes a first portion and a second portion, the second portion having a lower dopant concentration than the first portion,
   the first portion is formed adjacent the first electrode, and
   the second portion is formed adjacent the second electrode.

3. The device according to claim 2, wherein the first semiconductor region is in contact with the second electrode.

4. The device according to claim 3, wherein
   the plurality of third semiconductor regions are formed within a surface of the first semiconductor region.

5. The device according to claim 4, wherein the bonding portion is surrounded by the contact regions.

6. The device according to claim 4, wherein
   a plurality of bonding portions are formed thereon, and
   the respective plurality of bonding portions are surrounded by the contact regions.

7. The device according to claim 4, wherein
   a plurality of wirings are formed thereon, and
   the respective bonding portions of the plurality of wirings are surrounded by the contact regions.

8. The device according to claim 4, wherein each of the contact regions include:
   a first region that extends in a first direction intersecting with a second direction; and a second region that surrounds the first region.

9. The device according to claim 8, wherein
the bonding portion extends in the first direction.

10. The device according claim 9, wherein
the third semiconductor region extends across the first semiconductor region, and
the contact regions are separated by the third semiconductor regions in the first direction.

11. A method of manufacturing a semiconductor device, the method comprising:
    forming a first semiconductor region of a first conductivity type between a first electrode and a second electrode, the first semiconductor region being in contact with the first electrode;
    selectively forming a second semiconductor region of a second conductivity type between the first semiconductor region and the second electrode;
    forming a plurality of contact regions between the second semiconductor region and the second electrode, each contact region being in contact with the second semiconductor region and the second electrode;
    forming a plurality of third semiconductor regions of a second conductivity type between the second electrode and the first semiconductor region, each of the plurality of third semiconductor regions being in contact with the second electrode; and
    forming a wiring having a bonding portion that is in contact with the second electrode, a portion of the wiring bonded to the second electrode in a position between the contact regions adjacent the third semiconductor region.

12. The method according to claim 11, wherein the first semiconductor region is in contact with the second electrode.

13. The method according to claim 11, wherein the bonding portion is surrounded by the contact regions.

14. The method according to claim 11, further comprising:
    forming a plurality of wirings contacting the second electrode, wherein the respective bonding portions of the plurality of wirings are surrounded by the contact regions.

15. A semiconductor device comprising:
    a first electrode;
    a second electrode;
    a first semiconductor region of a first conductivity type formed between the first electrode and the second electrode and in contact with the first electrode and the second electrode;
    a second semiconductor region of a second conductivity type that is selectively formed between the first semiconductor region and the second electrode;
    a plurality of contact regions formed between the second semiconductor region and the second electrode, each contact region in contact with the second semiconductor region and the second electrode, wherein each of the contact regions include a first region that extends in a first direction intersecting with a second direction, and a second region that surrounds the first region;
    a plurality of third semiconductor regions of a second conductivity type formed between the second electrode and the first semiconductor region and in contact with the second electrode; and
    a wiring in contact with the second electrode via a bonding portion, a portion of the wiring bonded to the second electrode at a location between the contact regions adjacent to the third semiconductor region.

16. The device according to claim 15, wherein
the bonding portion extends in the first direction.

17. The device according claim 15, wherein
the third semiconductor region extends across the first semiconductor region, and
the contact regions are separated, along the first direction, by the third semiconductor regions.

18. The device according to claim 15, wherein the first semiconductor region includes a first portion and a second portion, the second portion having lower dopant concentration than the first portion,
the first portion is formed adjacent to the first electrode, and
the second portion is formed adjacent to the second electrode.

19. The device according to claim 15, wherein
the plurality of third semiconductor regions are formed in a surface of the first semiconductor region.

20. The device according to claim 15, wherein the bonding portion is surrounded by the contact regions.

* * * * *